United States Patent
Morishita

(10) Patent No.: US 11,675,023 B2
(45) Date of Patent: Jun. 13, 2023

(54) CONTROL DEVICE FOR INDUSTRIAL MACHINES

(71) Applicant: DENSO WAVE INCORPORATED, Chita-gun (JP)

(72) Inventor: Takeru Morishita, Chita-gun (JP)

(73) Assignee: DENSO WAVE INCORPORATED, Aichi-pref. (JP)

( * ) Notice: Subject to any disclaimer, the term of this patent is extended or adjusted under 35 U.S.C. 154(b) by 325 days.

(21) Appl. No.: 17/155,637

(22) Filed: Jan. 22, 2021

(65) Prior Publication Data

US 2021/0231748 A1 Jul. 29, 2021

(30) Foreign Application Priority Data

Jan. 24, 2020 (JP) .............................. JP2020-009765

(51) Int. Cl.
| | |
|---|---|
| *H02H 1/00* | (2006.01) |
| *G01R 31/52* | (2020.01) |
| *H02H 9/02* | (2006.01) |
| *G05B 19/05* | (2006.01) |

(52) U.S. Cl.
CPC ........... *G01R 31/52* (2020.01); *H02H 1/0007* (2013.01); *H02H 9/02* (2013.01); *G05B 19/054* (2013.01); *G05B 2219/1105* (2013.01)

(58) Field of Classification Search
None
See application file for complete search history.

(56) References Cited

U.S. PATENT DOCUMENTS

| | | | | |
|---|---|---|---|---|
| 8,278,934 | B2* | 10/2012 | Wang | H02P 29/0241 |
| | | | | 324/509 |
| 10,429,419 | B2* | 10/2019 | Choi | G01R 31/343 |
| 10,747,190 | B2* | 8/2020 | Maekawa | G01R 31/52 |
| 2009/0171603 | A1* | 7/2009 | Changali | H02H 1/0015 |
| | | | | 702/66 |
| 2019/0179283 | A1 | 6/2019 | Maekawa | |

* cited by examiner

*Primary Examiner* — Stephen W Jackson
(74) *Attorney, Agent, or Firm* — Oliff PLC

(57) ABSTRACT

A control device for industrial machines includes a plurality of signal input-output circuits configured such that pulse widths of pulse signals output from the signal input-output circuits are different from each other. The control device detects a fault when a pulse signal output from one of the signal input-output circuits has a pulse width different from the pulse width set to the one of the signal input-output circuits.

14 Claims, 6 Drawing Sheets

CONTROL DEVICE FOR INDUSTRIAL MACHINES

CROSS REFERENCE TO RELATED APPLICATION

The present application claims the benefit of priority from Japanese Patent Application No. 2020-009765 filed on Jan. 24, 2020. The entire disclosure of the above application is incorporated herein by reference.

TECHNICAL FIELD

The present disclosure relates to a control device for industrial machines.

BACKGROUND

Conventionally, there has been known an industrial control device that detects an occurrence of a short circuit between a first circuit and a second circuit. The first circuit converts an input first signal and outputs the converted first signal. The second circuit converts an input second signal and outputs the converted second signal.

SUMMARY

The present disclosure provides a control device for industrial machines. The control device includes a plurality of signal input-output circuits configured such that pulse widths of pulse signals output from the signal input-output circuits are different from each other. The control device detects a fault when a pulse signal output from one of the signal input-output circuits has a pulse width different from the pulse width set to the one of the signal input-output circuits.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
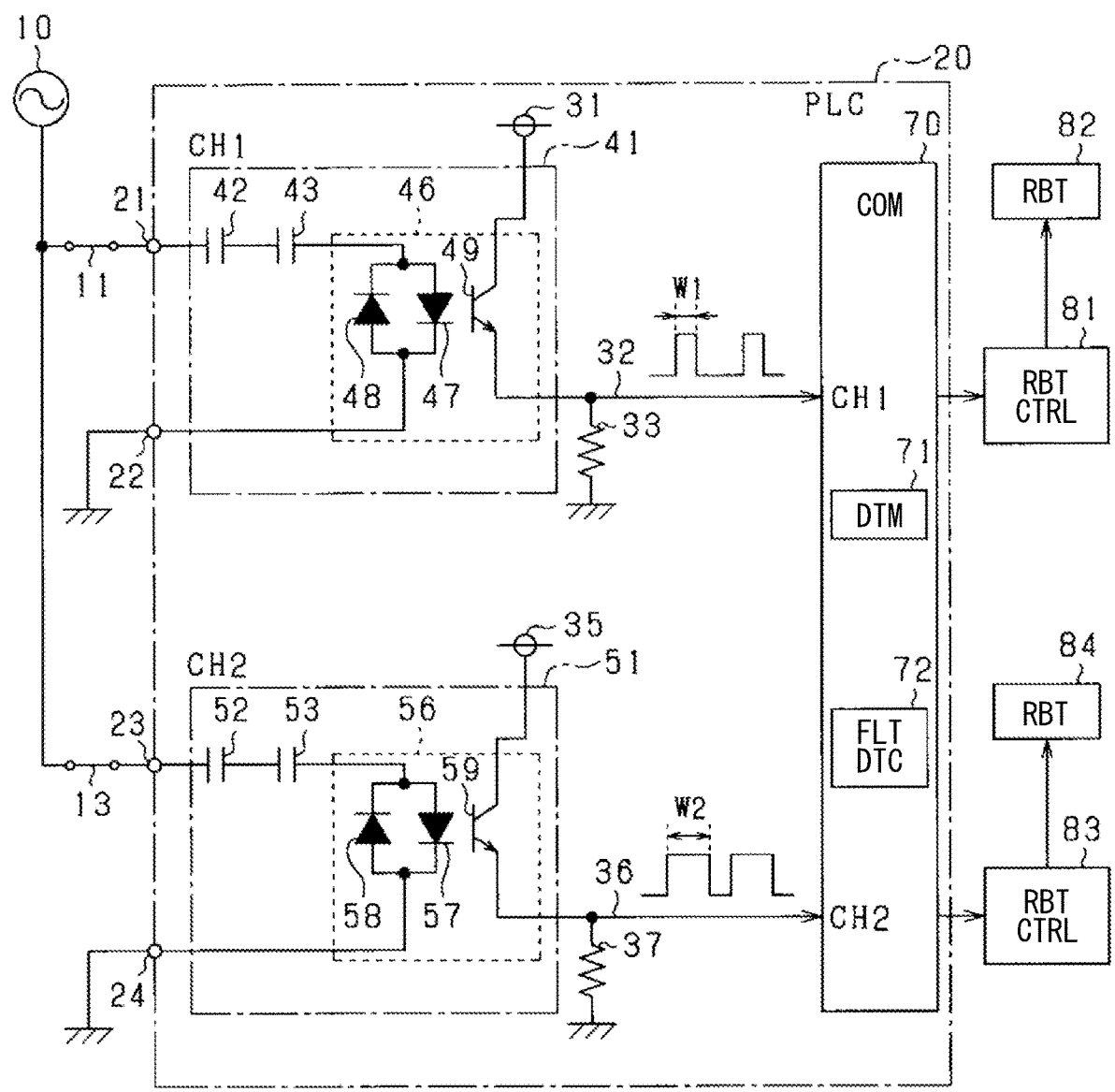
FIG. 1 is a circuit diagram showing a programmable logic controller (PLC), a plurality of robot controllers, and a plurality of robots.

An industrial control device includes an amplification instruction circuit, a voltage amplifier, and a specifying unit. The amplification instruction circuit outputs an amplification instruction signal indicating an amplification factor according to a comparison result between an input signal from a first circuit and an input signal from a second circuit. The voltage amplifier amplifies an input signal by the amplification factor indicated by the amplification instruction signal, and outputs the amplified signal. The specific unit specifies an occurrence of a short circuit between the first circuit and the second circuit according to the voltage value of the signal input from the voltage amplifier.

In the above-described industrial control device, it is necessary to add the amplification instruction circuit and the voltage amplifier in order to specify the occurrence of the short circuit between the first circuit and the second circuit. Therefore, it is inevitable that the circuit scale of the industrial control device will be large.

A control device for industrial machines according to one aspect of the present disclosure includes a plurality of signal input-output circuits, a determination unit, and a fault detection unit. Each of the signal input-output circuits is configured to receive an alternating current (AC) signal, convert the AC signal into a pulse signal, and output the pulse signal. The signal input-output circuits are further configured such that pulse widths of the pulse signals output from the signal input-output circuits are different from each other. The signal input-output circuits include a first signal input-output circuit. The determination unit is configured to determine that the AC signal is input to the first signal input-output circuit when the pulse signal having the pulse width set to the first signal input-output circuit is input from the first signal input-output circuit. The fault detection unit is configured to detect that a fault has occurred in the control device when the pulse signal having a pulse width different from the pulse width set to the first signal input-output circuit is input from the first signal input-output circuit.

A control device for industrial machines according to another aspect of the present disclosure includes a plurality of signal input-output circuits, a processor connected to the signal input-output circuits, and a memory. Each of the signal input-output circuits is configured to receive an alternating current (AC) signal, convert the AC signal into a pulse signal, and output the pulse signal. The signal input-output circuits are further configured such that pulse widths of the pulse signals output from the signal input-output circuits are different from each other. The signal input-output circuits include a first signal input-output circuit. The memory stores instructions configured to, when executed by the processor, cause the processor to determine that the AC signal is input to the first signal input-output circuit when the pulse signal having the pulse width set to the first signal input-output circuit is input to the processor from the first signal input-output circuit, and detect that a fault has occurred in the control device when the pulse signal having a pulse width different from the pulse width set to the first signal input-output circuit is input to the processor from the first signal input-output circuit.

The control devices according to the above aspects can detect a fault by setting the pulse widths of the pulse signals output from the signal input-output circuits to be different from each other. Therefore, an additional circuit is not necessary.

Hereinafter, one embodiment will be described with reference to the drawings. The present embodiment is embodied as a programmable logic controller (PLC) including a plurality of signal input-output circuits and controlling a plurality of robots (industrial machines).

As shown in FIG. 1, a PLC 20 (corresponding to a control device for an industrial machines) includes signal input-output circuits 41, 51, direct current (DC) power supplies 31, 35, resistors 33, 37, and a microcomputer (COM) 70.

The signal input-output circuit 41 (corresponding to a first signal input-output circuit) of a channel 1 (CH1) includes capacitors 42 and 43 (corresponding to current limiting elements) and a photocoupler 46. The capacitance of the capacitor 42 and the capacitance of the capacitor 43 are equal. The capacitor 42 and the capacitor 43 are connected in series.

The photocoupler 46 includes light emitting diodes 47 and 48 and a phototransistor 49. The light emitting diode 47 and the light emitting diode 48 are connected in antiparallel. Both ends of the light emitting diodes 47 and 48 are connected to first and second input terminals of the photocoupler 46, respectively. The input side of the photocoupler 46 is composed of the first and second input terminals of the photocoupler 46 and the light emitting diodes 47 and 48. The capacitors 42 and 43 are connected in series to the input side of the photocoupler 46.

The first input terminal of the photocoupler 46 is connected to an input terminal 21 of the PLC 20 via the capacitors 42 and 43. The second input terminal of the photocoupler 46 is connected to an input terminal 22 of the PLC 20. The input terminal 22 is connected to the ground. The input terminal 21 is connected to a commercial alternating current (AC) power supply 10 via an emergency stop switch 11. The commercial AC power supply 10 outputs a predetermined AC voltage (for example, 100 VAC voltage). The emergency stop switch 11 (corresponding to a switch) is a normally closed push button switch operated by a user. The emergency stop switch 11 connects the commercial AC power supply 10 and the input terminal 21 while not being pushed by the user, and disconnects the commercial AC power supply 10 and the input terminal 21 while being pushed by the user.

A collector of the phototransistor 49 is connected to a positive electrode of the DC power supply 31 via a first output terminal of the photocoupler 46. The DC power supply 31 outputs a predetermined DC voltage. An emitter of the phototransistor 49 is connected to an output signal line 32 of CH1 via a second output terminal of the photocoupler 46. The output signal line 32 is connected to the ground via the resistor 33 and is also connected to an input terminal of CH1 of the microcomputer 70. The output side of the photocoupler 46 is composed of the first and second output terminals of the photocoupler 46 and the phototransistor 49.

The signal input-output circuit 51 (corresponding to a second signal input-output circuit) of CH2 includes capacitors 52 and 53 (corresponding to current limiting elements) and a photocoupler 56. The photocoupler 56 is the same as the photocoupler 46. Light emitting diodes 57 and 58 and a phototransistor 59 are the same as the light emitting diodes 47 and 48 and the phototransistor 49, respectively. That is, the signal input-output circuit 51 of CH2 has a configuration similar to the configuration of the signal input-output circuit 41 of CH1 except that the capacitances of the capacitors 52 and 53 are different from the capacitances of the capacitors 42 and 43. The capacitance of the capacitor 52 and the capacitance of the capacitor 53 are equal. The capacitances of the capacitors 52 and 53 are larger than the capacitances of the capacitors 42 and 43.

A first input terminal of the photocoupler 56 is connected to an input terminal 23 of the PLC 20 via the capacitors 52 and 53. A second input terminal of the photocoupler 56 is connected to an input terminal 24 of the PLC 20. The input terminal 24 is connected to the ground. The input terminal 23 is connected to the commercial AC power supply 10 via an emergency stop switch 13 (corresponding to a switch). That is, the input sides of the photocouplers 46 and 56 are connected to the common commercial AC power supply 10 via the emergency stop switches 11 and 13 that arrow current to flow or interrupt the flow of current, respectively. The emergency stop switch 13 is the same as the emergency stop switch 11.

The DC power supply 35, an output signal line 36 of CH2 and the resistor 37 are the same as the DC power supply 31, the output signal line 32 of CH1 and the resistor 33, respectively. A collector of the phototransistor 59 is connected to a positive electrode of the DC power supply 35 via a first output terminal of the photocoupler 56. An emitter of the phototransistor 59 is connected to the output signal line 36 of CH2 via a second output terminal of the photocoupler 56. The output signal line 36 is connected to the ground via the resistor 37 and is also connected to an input terminal of CH2 of the microcomputer 70.

The microcomputer 70 includes a processor, a memory, an input-output interface, and the like. The microcomputer 70 realizes the functions of a determination unit (DTM) 71 and a fault detection unit (FLT DTC) 72 by executing instructions stored in the memory. These functions will be described later. The microcomputer 70 outputs commands such as an operation command and a stop command to robot controllers (RBT CTRL) 81 and 83 based on pulse signals input from the output signal line 32 of CH1 and the output signal line 36 of CH2. Specifically, when the microcomputer 70 determines that the emergency stop switches 11 and 13 are pushed, the microcomputer 70 outputs the stop commands to the robot controllers 81 and 83, respectively. The robot controllers 81 and 83 control the operations of robots (RBT) 82 and 84, respectively, based on the commands input from the microcomputer 70. The robots 82 and 84 are vertical articulated robots, for example.

Figure 2:
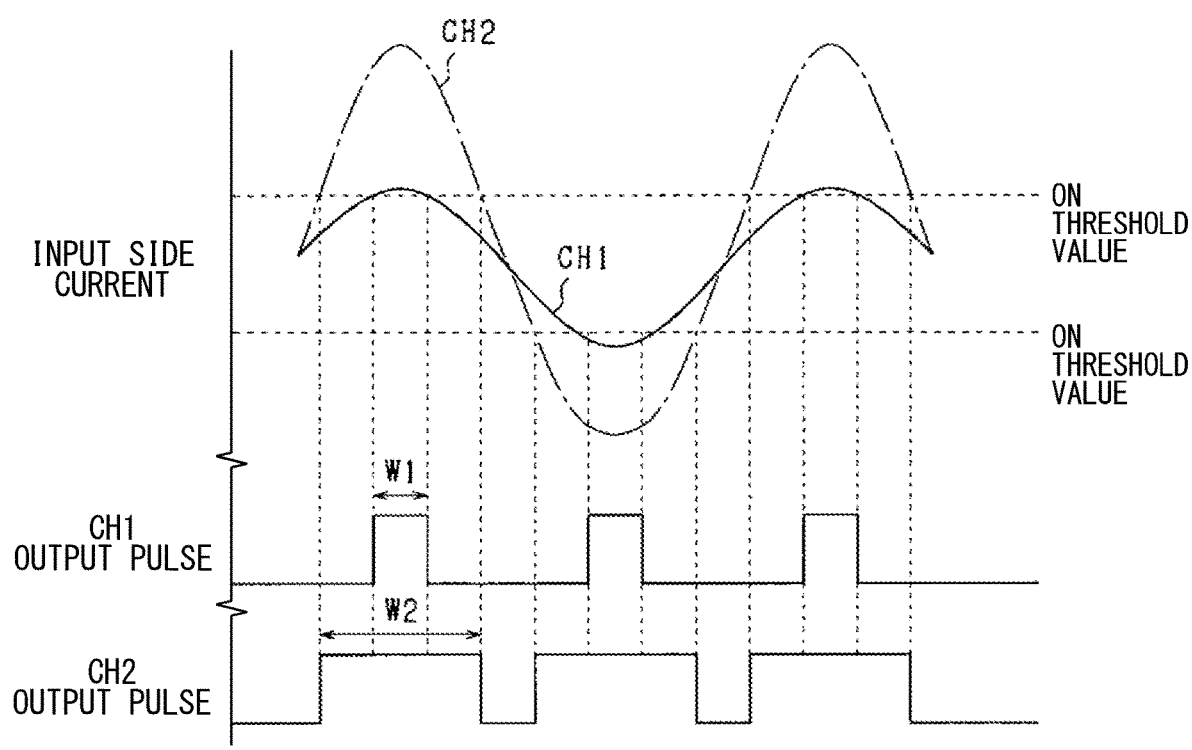
FIG. 2 is a timing diagram showing an input-side current, a CH1 output pulse, and a CH2 output pulse.

FIG. 2 is a timing diagram showing an input-side current, a CH1 output pulse, and a CH2 output pulse. The input-side current is a current that flows to each of the input side of the photocoupler 46 of CH1 and the input side of the photocoupler 56 of CH2. The CH1 output pulse and the CH2 output pulse are pulse signals output from the output signal line 32 of CH1 and the output signal line 36 of CH2, respectively. Here, the emergency stop switches 11 and 13 are not pushed, and the commercial AC power supply 10 and the input terminals 21 and 23 are connected.

When the predetermined AC voltage is applied from the input terminal 21 to the capacitors 42, 43 and the light emitting diodes 47, 48, a current limited according to the capacitances of the capacitors 42, 43 flows to the input side of the photocoupler 46 of CH1. Similarly, when the predetermined AC voltage is applied from the input terminal 23 to the capacitors 52, 53 and the light emitting diodes 57, 58, a current limited according to the capacitances of the capacitors 52, 53 flows to the input side of the photocoupler 56 of CH2. Here, since the capacitances of the capacitors 52 and 53 are larger than the capacitances of the capacitors 42 and 43, the input side current of CH2 is larger than the input side current of CH1. That is, the signal input-output circuit 41 of CH1 and the signal input-output circuit 51 of CH2 are set such that the degree to which the capacitors 42 and 43 limit the current and the degree to which the capacitors 52 and 53 limit the current are different.

During a period in which a current exceeding an ON threshold value (corresponding to a predetermined current) flows through the light emitting diodes 47 and 48, the phototransistor 49 conducts and a DC voltage is output from the output signal line 32 of CH1. Accordingly, a pulse signal of CH1 that becomes a high level at a cycle corresponding to the cycle of the AC voltage of the commercial AC power supply 10 is output. Similarly, during a period in which a current exceeding the ON threshold value (corresponding to the predetermined current) flows through the light emitting diodes 57 and 58, the phototransistor 59 conducts. Then, a pulse signal of CH2 is output from the output signal line 36 of CH2. At this time, a pulse width W2 of the pulse signal of CH2 is wider than a pulse width W1 of the pulse signal of CH1.

That is, the signal input-output circuits 41 and 51 convert the AC signal into the pulse signals and output the pulse signals. The signal input-output circuits 41 and 51 are set such that the pulse widths W1 and W2 of the pulse signals output from the signal input-output circuits 41, 51 are different from each other.

The determination unit 71 determines that the predetermined AC voltage (corresponding to an AC signal) is input to the input terminal 21 connected to the signal input-output circuit 41 of CH1 when the pulse signal having the pulse width W1, which is set to the signal input-out circuit 41 of CH1, is input from the output signal line 32 connected to the signal input-output circuit 41 of CH1. Specifically, when the difference between the pulse width of the pulse signal input from the output signal line 32 and the pulse width W1 is within an error range, the determination unit 71 determines that the predetermined AC voltage is input to the input terminal 21, that is, the emergency stop switch 11 is not pushed. On the other hand, when a pulse signal having a pulse width within the error range of the pulse width W1 is not input from the output signal line 32, the determination unit 71 determines that the predetermined AC voltage is not input to the input terminal 21, that is, the emergency stop switch 11 is pushed. The determination unit 71 may determine that the predetermined AC voltage is input to the input terminal 21 when the absolute value of the difference between the pulse width of the pulse signal input from the output signal line 32 and the pulse width W1 is within a predetermined value.

Similarly, the determination unit 71 determines that the predetermined AC voltage (corresponding to an AC signal) is input to the input terminal 23 connected to the signal input-output circuit 51 of CH2 when the pulse signal having the pulse width W2, which is set to the signal input-out circuit 51 of CH2, is input from the output signal line 36 connected to the signal input-output circuit 51 of CH2.

Figure 3:
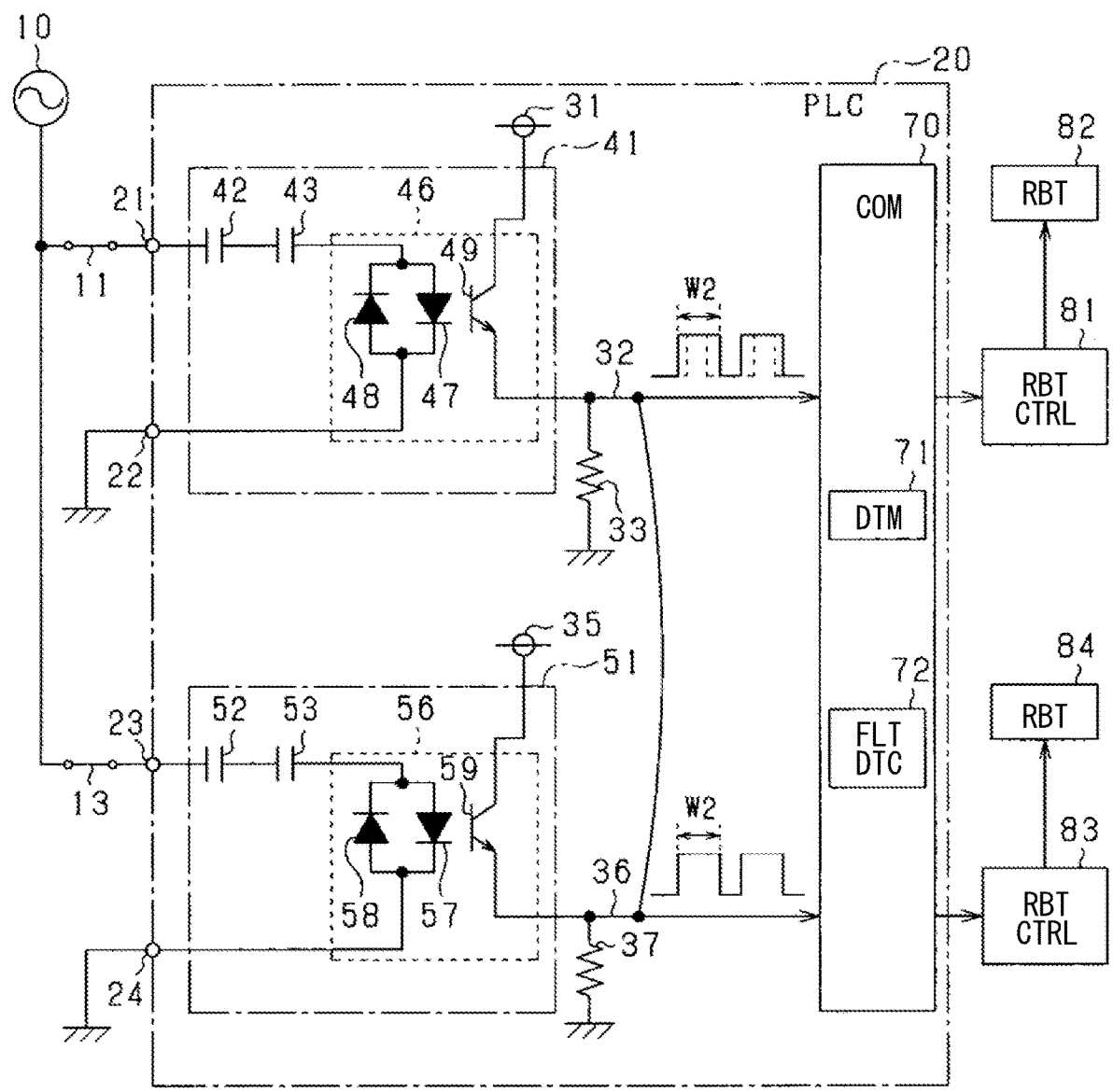
FIG. 3 is a circuit diagram showing a state in which output signal lines are short-circuited with each other.

As shown in FIG. 3, the output signal line 32 of CH1 and the output signal line 36 of CH2 may be short-circuited with each other. In this case, the pulse signal output from the signal input-output circuit 51 of CH2 may be superimposed on the pulse signal output from the signal input-output circuit 41 of CH1. As a result, even if the user pushes the emergency stop switch 11, the pulse signal may be input to the microcomputer 70. In this case, the pulse width of the pulse signal input to the microcomputer 70 from the output signal line 32 connected to the signal input-output circuit 41 of CH1 changes from the pulse width W1 set to the signal input-output circuit 41 of CH1.

Therefore, the fault detection unit 72 detects that a fault has occurred in the PLC 20 when the pulse signal having the pulse width different from the pulse width W1 set to the signal input-output circuit 41 of CH1 is input from the output signal line 32 connected to the signal input-output circuit 41 of CH1. Specifically, when a pulse signal having a pulse width outside the error range of the pulse width W1 is input from the output signal line 32, the fault detection unit 72 detects that a fault has occurred in the PLC 20. In particular, the fault detection unit 72 detects that the signal input-output circuit 41 of CH1 and the signal input-output circuit 51 of CH2 are shot-circuited when the pulse signal having the pulse width W2, which is set to the signal input-output circuit 51 of CH2, from the output signal line 32 connected to the signal input-output circuit 41 of CH1. The fault detection unit 72 may detect that a fault has occurred in the PLC 20 when a pulse signal having a pulse width outside the predetermined range including the pulse width W1 is input from the output signal line 32.

Figure 4:
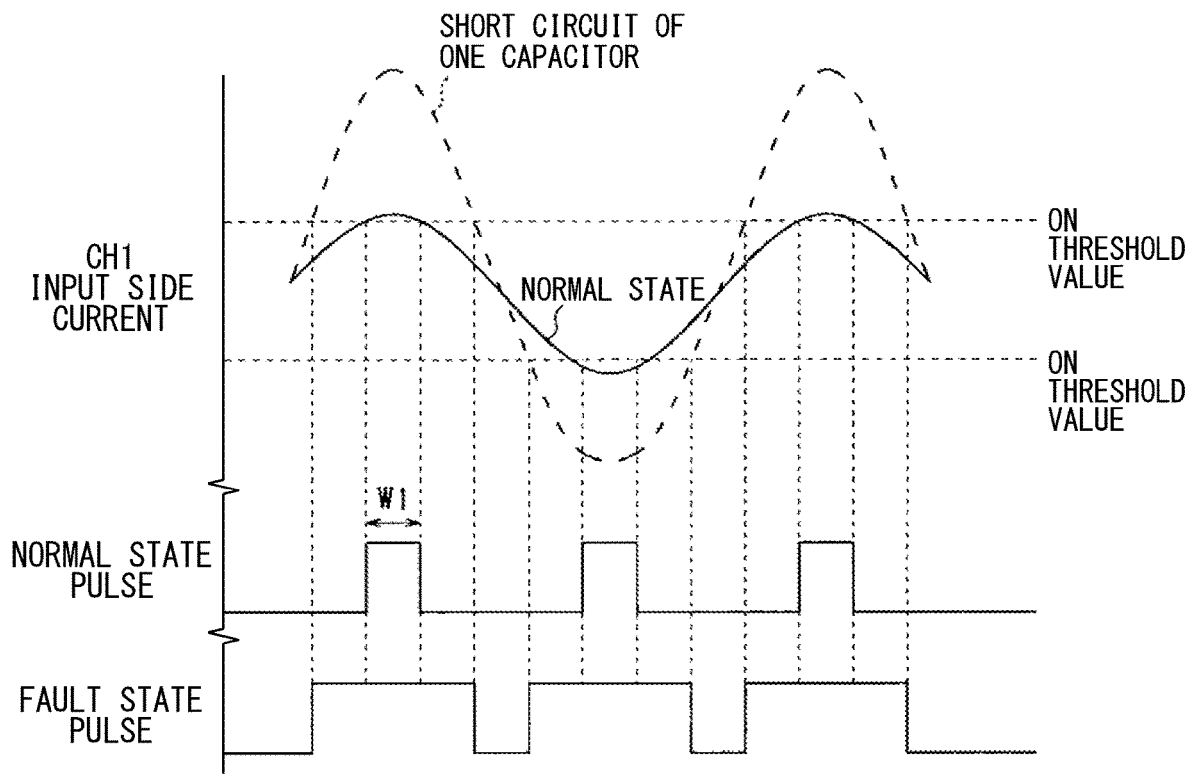
FIG. 4 is a timing diagram showing a CH1 input-side current, a normal state pulse, and a fault state pulse.

In addition, one of the capacitors 42 and 43 may be short-circuited to become a conductive state. In this case, as shown in FIG. 4, the current flowing to the input side of CH1 becomes larger than the current in the normal state. As a result, as shown as a fault state pulse, the pulse width of the pulse signal input to the microcomputer 70 from the output signal line 32 connected to the signal input-output circuit 41 of CH1 changes from the pulse width W1 in the normal state set to the signal input-output circuit 41 of CH1. That is, when one of the capacitors 42, 43 that set the pulse width W1 in the signal input-output circuit 41 of CH1 fails, the pulse width of the pulse signal output from the signal input-output circuit 41 of CH1 changes from the pulse width W1 set to the signal input-output circuit 41. The capacitors 42, 43 corresponds to elements setting the pulse width.

Therefore, the fault detection unit 72 detects that a fault has occurred in the PLC 20 when the pulse signal having the pulse width different from the pulse width W1 set to the signal input-output circuit 41 of CH1 is input from the output signal line 32 connected to the signal input-output circuit 41. Specifically, when a pulse signal having a pulse width wider than a predetermined width (predetermined ratio) than the pulse width W1 set to the signal input-output circuit 41 of CH1 is input from the output signal line 32 of CH1, the fault detection unit 72 detects that one of the capacitors 42, 43 is short-circuited. The fault detection unit 72 also detects that a fault has occurred in the PLC 20 when a pulse signal having a pulse with different from the pulse width W2 set to the signal input-output circuit 51 of CH2 is input from the output signal line 36 connected to the signal input-output circuit 51 of CH2.

Figure 5:
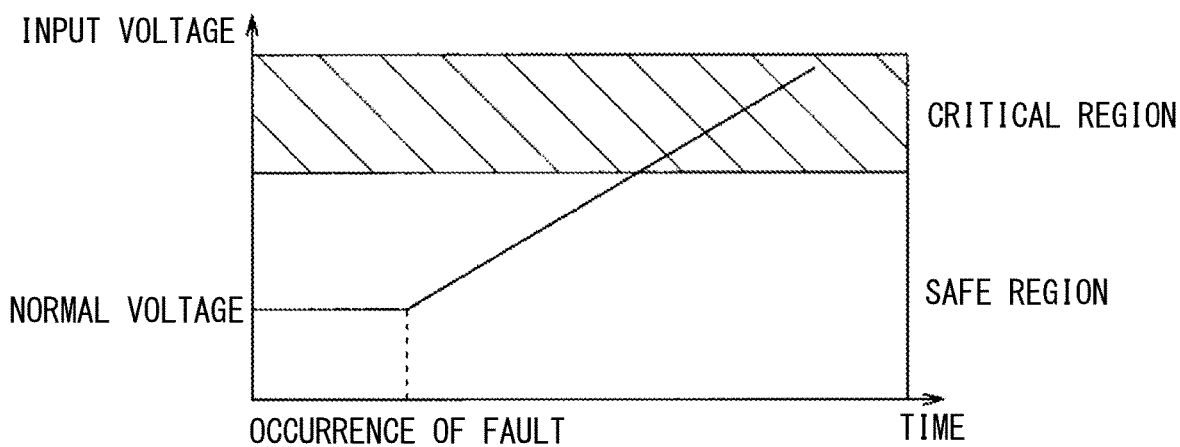
FIG. 5 is a timing diagram showing an input voltage at an occurrence of an overvoltage fault.

Further, as shown in FIG. 5, the AC voltage input to the signal input-output circuit 41 of CH1 may become excessive (that is, may enter a critical region) due to a fault or the like. Then, if one of the capacitors 42 and 43 is short-circuited to become the conductive state and the AC voltage input to the signal input-output circuit 41 of CH1 becomes excessive, the photocoupler 46 may fail. In that case, even if the user pushes the emergency stop switch 11, the pulse signal may be output from the signal input-output circuit 41 of CH1. Since the signal input-output circuit 41 of CH1 converts the AC voltage (AC signal) into the pulse signal and outputs the pulse signal, if the AC voltage input to the signal input-output circuit 41 of CH1 becomes excessive, the pulse width of the pulse signal output from the output circuit 41 changes from the pulse width W1 set to the signal input-output circuit 41 of CH1.

Therefore, the fault detection unit 72 detects that a fault has occurred in the PLC 20 when the pulse signal having the pulse width different from the pulse width W1 set to the signal input-output circuit 41 of CH1 is input from the output signal line 32 connected to the signal input-output circuit 41. Specifically, the fault detection unit 72 detects that the AC voltage input to the signal input-output circuit 41 of CH1 has become excessive when a pulse signal having a pulse width wider than the pulse width W1 set to the signal input-output circuit 41 of CH1 by a predetermined width (predetermined ratio) is input from the output signal line 32 of CH1. The fault detection unit 72 also detects that the AC voltage input to the signal input-output circuit 51 of CH2 has become excessive when a pulse signal having a pulse width wider than the pulse width W2 set to the signal input-output circuit 51 of CH2 by a predetermined width (predetermined ratio) is input from the output signal line 36 of CH2.

In short, the fault detection unit 72 detects that one of the following three faults has occurred when a pulse signal having a pulse width different from the pulse width set to the signal input-output circuit 41 of CH1 is input from the signal input-output circuit 41.

1. The signal input-output circuit 41 of CH1 and the signal input-output circuit 51 of CH2 are short-circuited (i.e., a plurality of signal input-output circuits are short-circuited with each other).

2. The capacitors 42, 43 in the signal input-output circuit 41 of CH1 that set the pulse width W1 have failed.

3. The AC voltage (AC signal) input to the signal input-output circuit 41 of CH1 has become excessive.

The fault detection unit 72 also detects similar faults when a pulse signal having a pulse width different from the pulse width set to the signal input-output circuit 51 of CH2 is input from the signal input-output circuit 51.

The present embodiment described above in detail has the following advantages. In the following description, reference numbers of the elements of the channel 2 are parenthesized to facilitate the understanding of the corresponding relationship.

The determination unit 71 determines that the AC voltage (the AC signal) is input to the signal input-output circuit 41 (51) on condition that a pulse signal having the pulse width W1 (W2) set to the signal input-output circuit 41 (51) is input from the signal input-output circuit 41 (51). Therefore, when a pulse signal having the pulse width W1 (W2) set to the signal input-output circuit 41 (51) is input from the signal input-output circuit 41 (51), the determination unit 71 determines that the AC voltage is input to the signal input-output circuit 41 (51). On the other hand, when a pulse signal having the pulse width W1 (W2) set to the signal input-output circuit 41 (51) is not input from the signal input-output circuit 41 (51), the determination unit 71 does not determine that AC voltage is input to the output circuit 41 (51).

When the signal input-output circuits 41 and 51 are short-circuited with each other, the pulse width W1 (W2) of the pulse signal received from the signal input-output circuit 41 (51) may change from the pulse width W1 (W2) set to the signal input-output circuit 41 (51). In that case, the microcomputer 70 does not receive the pulse signal having the pulse width W1 (W2) set to the signal input-output circuit 41 (51) from the signal input-output circuit 41 (51), and does not determine that the AC voltage is input to the signal input-output circuit 41 (51).

The fault detection unit 72 detects that a fault has occurred in a control device when the microcomputer receives a pulse signal having a pulse width different from the pulse width W1 (W2) set to the signal input-output circuit 41 (51) from the signal input-output circuit 41 (51). Therefore, in the signal input-output circuits 41 and 51, the above faults can be detected by making the pulse widths W1 and W2 of the pulse signals output from each other different, and it is possible to suppress the need for an additional circuit.

When receiving a pulse signal having a pulse width different from the pulse width W1 (W2) set to the signal input-output circuit 41 (51) from the signal input-output circuit 41 (51), the fault detection unit 72 detects an occurrence of at least one of faults that the signal input-output circuits 41 and 51 are short-circuited to each other, one the capacitors 42, 43 (the capacitors 52, 53) setting the pulse width W1 (W2) of the signal input-output circuit 41 (51) has failed, and the AC voltage input to the signal input-output circuit 41 (51) has become excessive. Therefore, no matter which of these three faults has occurred, it is possible to detect that the fault has occurred.

The common AC voltage is input to the signal input-output circuits 41 and 51. Therefore, the output source of the AC voltage can be unified, and the configuration for inputting the AC voltage to the signal input-output circuit 41 (51) can be simplified.

The signal input-output circuit 41 (51) includes the photocoupler 46 (56) that conducts the output side to which a predetermined DC voltage is applied when a current exceeding the ON threshold value (predetermined current) flows through the input side, and the capacitors 42, 43 (52, 53) connected in series to the input side of the photocoupler 46 (56). Therefore, during a period in which the AC voltage is input to the input side of the photocoupler 46 (56) and the current exceeding the ON threshold flows through the input side, the output side to which the predetermined DC voltage is applied conducts and the DC voltage is output from the output side. Therefore, the signal input-output circuit 41 (51) that converts the AC voltage into the pulse signal and outputs the pulse signal when receiving the AC voltage can be realized by a simple circuit configuration.

The signal input-output circuit 41 and the signal input-output circuit 51 are set so that the capacitors 42, 43 and the capacitors 52, 53 limit the current differently. Therefore, in the signal input-output circuits 41 and 51, when the common AC voltage is input, periods in which the current exceeding the ON threshold value flows to the input side of the photocouplers 46 and 56 can be made different from each other. Therefore, the signal input-output circuits 41 and 51 in which the pulse widths W1 and W2 of the pulse signals are set to be different from each other can be realized by changing the settings of the capacitors 42, 43, 52 and 53 without requiring an additional circuit.

The capacitors 42 and 43 are connected in series, and the capacitors 52, 53 are connected in series. According to the above configuration, even if one of the two capacitors is short-circuited, the flow of an excessive current to the input side of the photocoupler 46 or 56 can be suppressed by the remaining one capacitor.

The input sides of the photocoupler 46 and 56 are connected to the common commercial AC power supply 10 via the emergency stop switch 11 and 13 that allow current to flow or interrupt the flow of current, respectively. According to the above configuration, in the configuration using the common commercial AC power supply 10, the state in which the common AC voltage is input to the signal input-output circuits 41 and 51 and the state in which the common AC voltage is not input are switched by the emergency stop switches 11 and 13.

The fault detection unit 72 detects that the signal input-output circuit 41 of CH1 and the signal input-output circuit 51 of CH2 are short-circuited to each other when receiving a pulse signal having the pulse width W2 When the fault detection unit 72 inputs a pulse signal having a pulse width W2 set to the signal input-output circuit 51 of CH2 from the signal input-output circuit 41 of CH1. Therefore, it can be identified that the fault that has occurred in the PLC 20 is a short circuit between the signal input-output circuit 41 of CH1 and the signal input-output circuit 51 of CH2.

The embodiment described above may be modified in the following manners. Parts identical to the parts of the above embodiment are designated by the same reference signs as the above embodiment to omit redundant description.

The configuration is not limited to the configuration in which the two capacitors 42, 43 (52, 53) are connected in series to the input side of the photocoupler 46 (56), and a configuration in which three capacitors are connected in series may also be adopted. In this case, even if one of the three capacitors is short-circuited, the flow of an excessive current to the input side of the photocoupler 46 (56) can be suppressed by the remaining two capacitors. Further, even if two of the three capacitors are short-circuited, the flow of an excessive current to the input side of the photocoupler 46 (56) can be suppressed by the remaining one capacitor. However, it is desirable that the number of capacitors as a current limiting element that limits the current input to the input side of the photocoupler 46 (56) is the minimum necessary.

Figure 6:
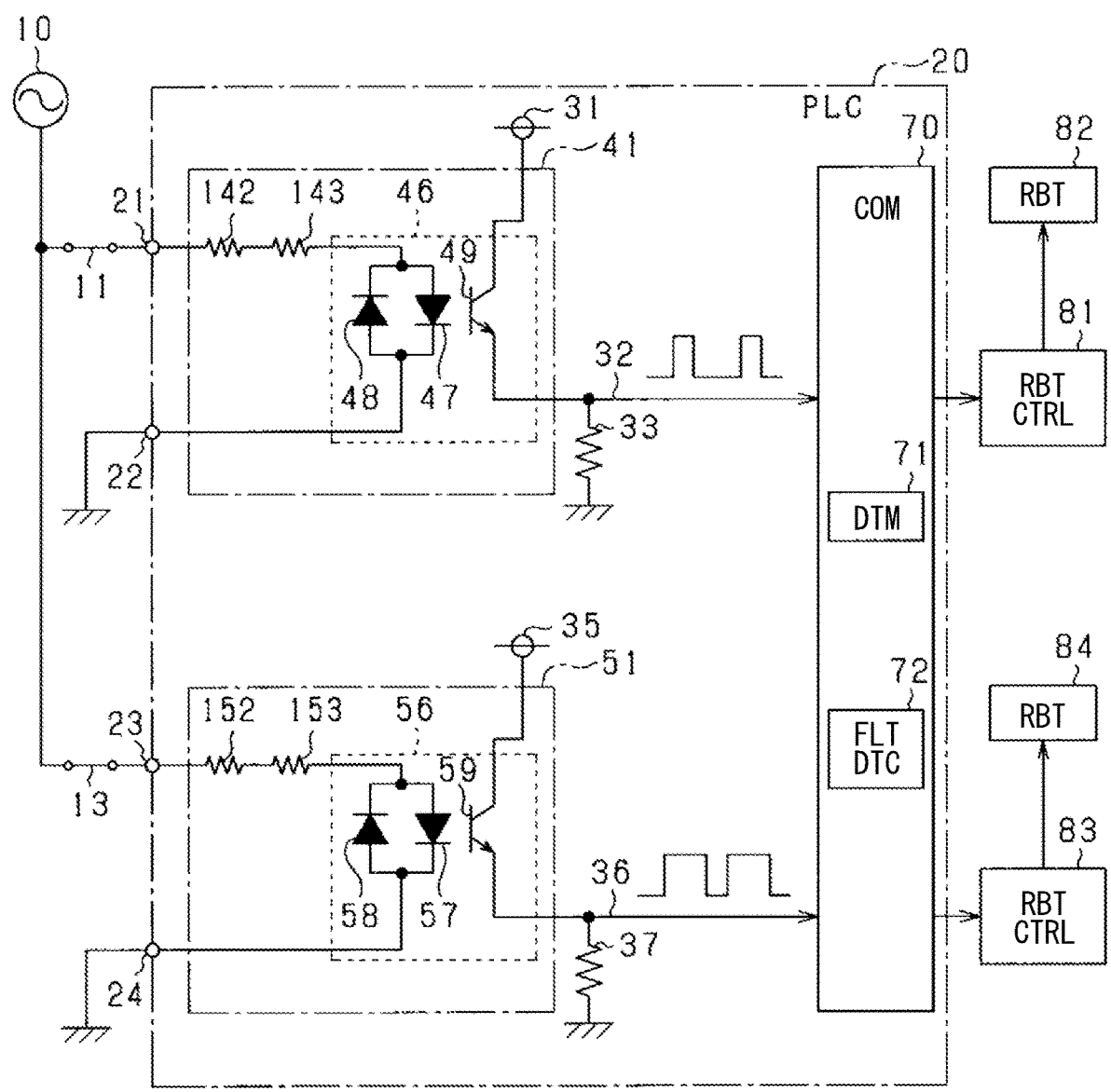
FIG. 6 is a circuit diagram showing a modified example of current limiting elements.

As shown in FIG. 6, as a current limiting element connected in series with the input side of the photocoupler 46 (56), two resistors 142, 143 (152, 153) connected in series with each other can also be adopted. According to such a configuration, even if one of the two resistors 142, 143 (152, 153) is short-circuited, an excessive current flows to the input side of the photocoupler 46 (56) can be suppressed by the remaining one resistor. In another modification, three resistors can be connected in series on the input side of the photocoupler 46 (56).

Figure 7:
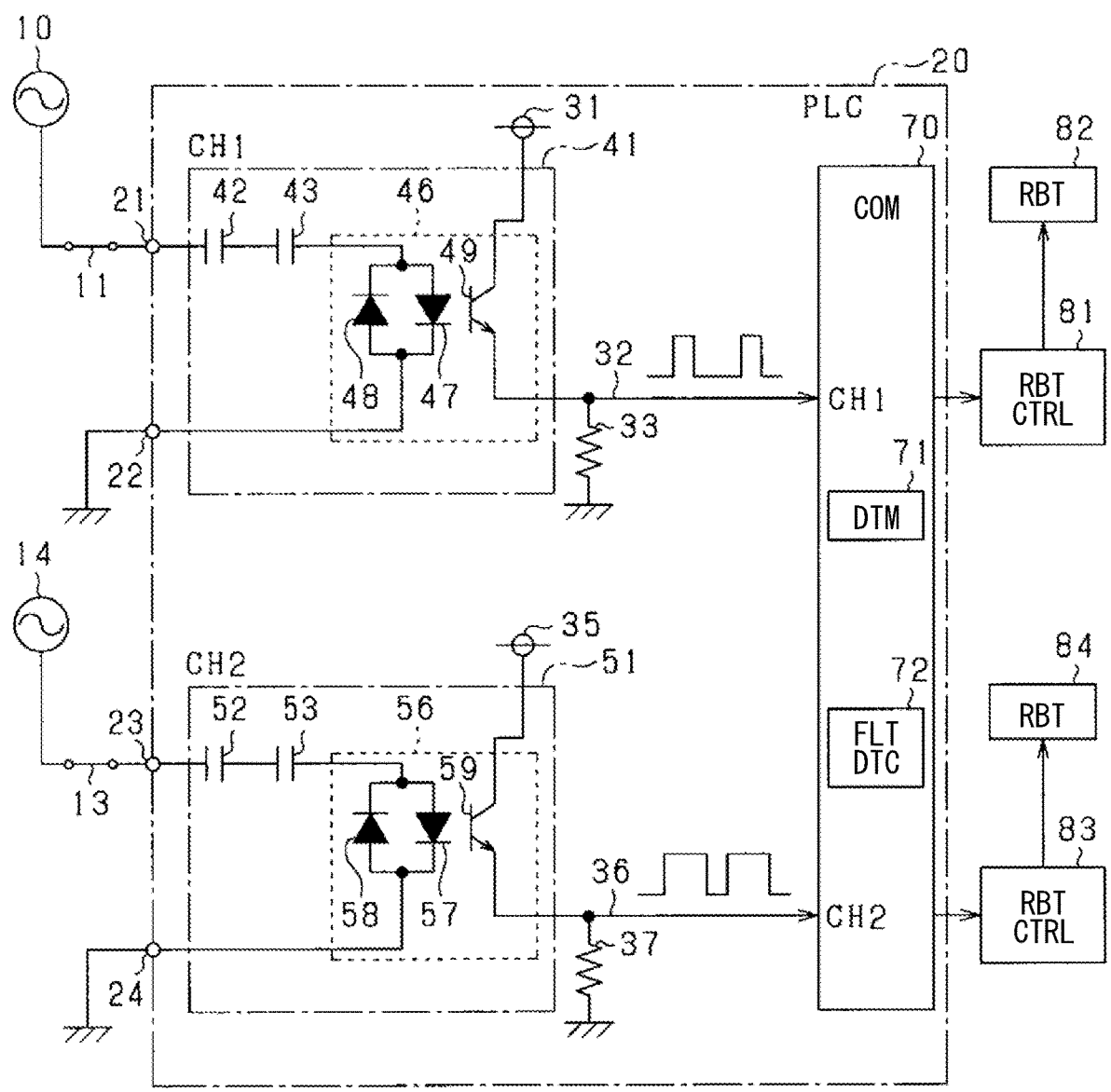
FIG. 7 is a circuit diagram showing an example of changing an input voltage.

As shown in FIG. 7, the input sides of the photocouplers 46 and 56 may be connected to the individual commercial AC power supplies 10 and 14 via the emergency stop switches 11 and 13, respectively. The voltages applied by the commercial AC power supplies 10 and 14 may be the same voltage or different voltages. Even in that case, the signal input-output circuits 41 and 51 may be set so that the pulse widths of the pulse signals output from each other are different. In another modification, not limiting the commercial AC power supplies 10 and 14, an AC signal output from an AC signal generator or the like can also be input to the signal input-output circuits 41 and 51.

Instead of the emergency stop switches 11 and 13 which are the normally closed push button switches operated by the user, start switches which are normally opened push button switches operated by the user can also be adopted. In this case, the abnormality detection unit 72 detects a fault in the PLC 20 while the start switch is pushed.

The signal input-output circuits 41 and 51 are not limited to a configuration including a current limiting element and a photocoupler, but a configuration including an AD converter and a comparator can also be adopted. Even in that case, the signal input-output circuits 41 and 51 can be set such that the pulse widths of the pulse signals output from each other are different by making the reference voltages of the comparators different from each other.

The PLC 20 is not limited to a configuration including two signal input-output circuits 41 and 51, and controlling the robots 82 and 84 corresponding to the signal input-output circuits 41 and 51, respectively. The PLC 20 may have a configuration including three or more signal input-output circuits and controlling robots corresponding to the three or more signal input-output circuits, respectively.

The control device that controls the robots 82 and 84 via the robot controllers 81 and 83 is not limited to the PLC 20, and may be an electronic control device (ECU) or the like having the same function as the PLC 20.

As the industrial machines, not only the robots 82 and 84 but also machine tools and the like can be adopted.

What is claimed is:

1. A control device for industrial machines, comprising:
a plurality of signal input-output circuits each of which is configured to receive an alternating current (AC) signal, convert the AC signal into a pulse signal, and output the pulse signal, the signal input-output circuits further configured such that pulse widths of the pulse signals output from the signal input-output circuits are different from each other, the signal input-output circuits including a first signal input-output circuit;
a determination unit configured to determine that the AC signal is input to the first signal input-output circuit when the pulse signal having the pulse width set to the first signal input-output circuit is input from the first signal input-output circuit; and
a fault detection unit configured to detect that a fault has occurred in the control device when the pulse signal having a pulse width different from the pulse width set to the first signal input-output circuit is input from the first signal input-output circuit.

2. The control device according to claim 1, wherein
the fault detection unit is further configured to detect an occurrence of one of faults that the first signal input-output circuit have been short-circuited with another one of the signal input-put circuits, an element of the first signal input-output circuit setting the pulse width has failed, and the AC signal input to the first signal input-output circuit has become excessive when the pulse signal having the pulse width different from the pulse width set to the first signal input-output circuit is input from the first signal input-output circuit.

3. The control device according to claim 1, wherein
the signal input-output circuits are further configured to receive the AC signal that is common to each other,
each of the signal input-output circuits includes a photocoupler and a current liming element,
the photocoupler has an input side and an output side, and is configured to conduct the output side applied with a predetermined direct-current voltage when an electric current exceeding a predetermined current flows through the input side,
the current limiting element is connected in series to the input side of the photocoupler, and
degrees of current limitation of the current limiting elements in the signal input-output circuits are set to be different from each other.

4. The control device according to claim 3, wherein
the current limiting element in each of the signal input-output circuits includes two capacitors connected in series.

5. The control device according to claim 3, wherein
the current limiting element in each of the signal input-output circuits includes two resistors connected in series.

6. The control device according to claim 3, wherein
the input side of the photocoupler in each of the signal input-output circuits is connected to a common commercial AC power supply via a switch that allows a current to flow or interrupts the current.

7. The control device according to claim 1, wherein
the signal input-output circuits further include a second signal input-output circuit, and
the fault detection unit is further configured to detect that the first signal input-output circuit have been short-circuited with the second signal input-output circuit when the pulse signal having the pulse width set to the second signal input-output circuit is input from the first signal input-output circuit.

8. A control device for industrial machines, comprising:
a plurality of signal input-output circuits each of which is configured to receive an alternating current (AC) signal, convert the AC signal into a pulse signal, and output the pulse signal, the signal input-output circuits further configured such that pulse widths of the pulse signals output from the signal input-output circuits are different from each other, the signal input-output circuits including a first signal input-output circuit;
a processor connected to the signal input-output circuits; and
a memory storing instructions configured to, when executed by the processor, cause the processor to:
determine that the AC signal is input to the first signal input-output circuit when the pulse signal having the pulse width set to the first signal input-output circuit is input to the processor from the first signal input-output circuit; and
detect that a fault has occurred in the control device when the pulse signal having a pulse width different from the pulse width set to the first signal input-output circuit is input to the processor from the first signal input-output circuit.

9. The control device according to claim 8, wherein
the instructions are further configured to, when executed by the processor, cause the processor to detect an occurrence of one of faults that the first signal input-output circuit have been short-circuited with another one of the signal input-output circuits, an element of the first signal input-output circuit setting the pulse width has failed, and the AC signal input to the first signal input-output circuit has become excessive when the pulse signal having the pulse width different from the pulse width set to the first signal input-output circuit is input to the processor from the first signal input-output circuit.

10. The control device according to claim 8, wherein
the signal input-output circuits are further configured to receive the AC signal that is common to each other,
each of the signal input-output circuits includes a photocoupler and a current liming element,
the photocoupler has an input side and an output side, and is configured to conduct the output side applied with a predetermined direct-current voltage when an electric current exceeding a predetermined current flows through the input side,
the current limiting element is connected in series to the input side of the photocoupler, and
degrees of current limitation of the current limiting element in signal input-output circuits are different from each other.

11. The control device according to claim 10, wherein
the current limiting element in each of the signal input-output circuits includes two capacitors connected in series.

12. The control device according to claim 10, wherein
the current limiting element in each of the signal input-output circuits includes two resistors connected in series.

13. The control device according to claim 10, wherein
the input side of the photocoupler in each of the signal input-output circuits is connected to a common commercial AC power supply via a switch that allows a current to flow or interrupts the current.

14. The control device according to claim 8, wherein
the signal input-output circuits further include a second signal input-output circuit, and
the instructions are further configured to, when executed by the processor, cause the processor to detect that the first signal input-output circuit have been short-circuited with the second signal input-output circuit when the pulse signal having the pulse width set to the second signal input-output circuit is input to the processor from the first signal input-output circuit.

* * * * *